United States Patent [19]

Wright et al.

[11] Patent Number: 4,826,779

[45] Date of Patent: May 2, 1989

[54] INTEGRATED CAPACITOR AND METHOD OF FABRICATING SAME

[75] Inventors: James R. Wright, San Jose; Philip Shiota, Saratoga, both of Calif.

[73] Assignee: Teledyne Industries, Inc., Mountain View, Calif.

[21] Appl. No.: 922,710

[22] Filed: Oct. 24, 1986

[51] Int. Cl.$^4$ .................... H01L 21/265; H01L 29/94
[52] U.S. Cl. ..................... 437/020; 437/47; 437/52; 437/919
[58] Field of Search ............. 148/DIG. 118, DIG. 82, 148/DIG. 83, DIG. 14; 357/54, 23.6, 51; 437/20, 52, 60, 41, 47, 919

[56] References Cited

U.S. PATENT DOCUMENTS

| | | | |
|---|---|---|---|
| 3,696,276 | 10/1972 | Boland | 357/54 |
| 3,893,146 | 7/1975 | Heeren | 357/14 |
| 4,042,945 | 8/1977 | Lin et al. | 357/54 |
| 4,219,379 | 8/1980 | Athamas | 29/571 |
| 4,335,505 | 6/1982 | Shibata et al. | 357/54 |
| 4,442,589 | 4/1984 | Doo et al. | 29/571 |
| 4,455,568 | 6/1984 | Shiota | 148/DIG. 14 |
| 4,466,177 | 10/1984 | Chao | 29/571 |
| 4,507,159 | 3/1985 | Erb | 437/52 |
| 4,558,343 | 12/1985 | Arizumi et al. | 357/54 |
| 4,603,059 | 7/1986 | Kiyosumi et al. | 357/54 |

FOREIGN PATENT DOCUMENTS

| | | | |
|---|---|---|---|
| 0085853 | 7/1981 | Japan | 437/52 |
| 0220455 | 9/1986 | Japan | 437/52 |

OTHER PUBLICATIONS

Janssen's et al., "The use of 1.1.y Trichloroethane as an Optimized Additive to improve the silicon thermal oxidation technology" J. of Electrochem. Soc. vol. 125, No. 10, 1696–703, Oct. 78.

Gdula, "Composite Dielectric Layer", IBM TDB, vol. 14, No. 9 Feb. 72, p. 2609.

Cheng et al., "Oxidation Characteristics and Electrical Properties of Low Pressure Dual TCE," J. Electroch. Soc. Feb. 1984 pp. 354–359.

Cardon & Franson "Dynamic Semiconductor RAM Structures" Pergamon Press, 1984, pp. 47–50, 153–157, 1984.

*Primary Examiner*—Olik Chaudhuri
*Attorney, Agent, or Firm*—Fleisler, Dubb, Meyer & Lovejoy

[57] ABSTRACT

An integrated capacitor having an oxide layer of less than 500 Å as a dielectric or insulator. A method of fabricating a capacitor including the steps of forming an oxide layer on a substrate, forming through the oxide layer a first capacitor plate in the substrate, and forming a second capacitor plate on the oxide layer. The method also includes the step of restructuring the oxide layer after the step of forming the first capacitor plate. Since the first capacitor plate is formed through the oxide layer the oxide layer can be grown on an undoped or lightly doped substrate; thus, the effects of the doping level on the growth rate of the oxide layer are eliminated and oxide layers having a uniform thickness of less than 500 Å can consistently be provided.

17 Claims, 1 Drawing Sheet

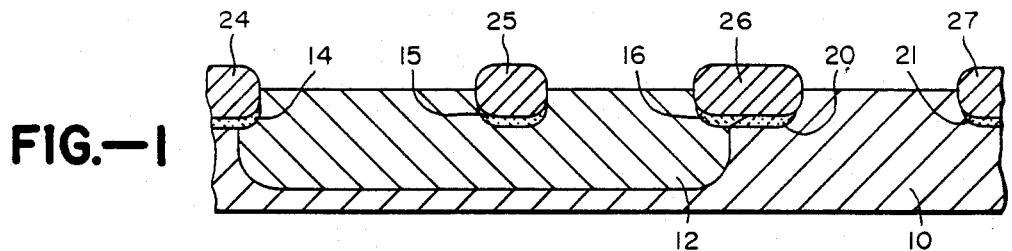
FIG.—1
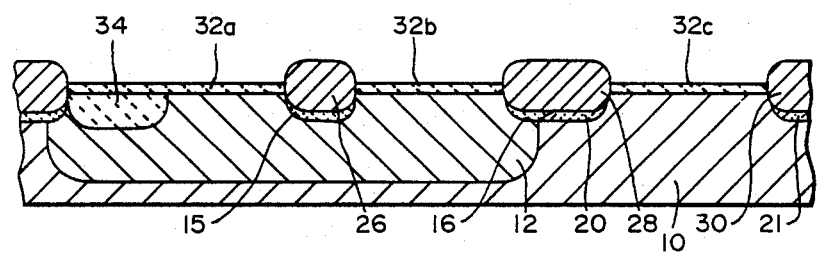
FIG.—2
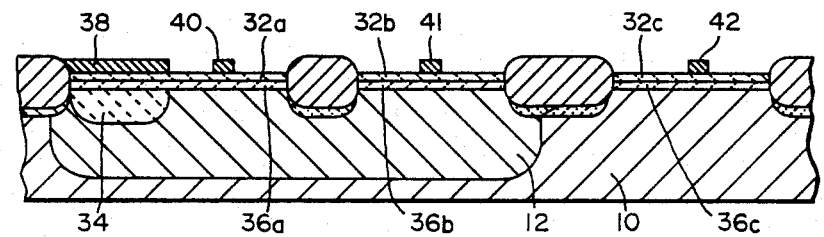
FIG.—3
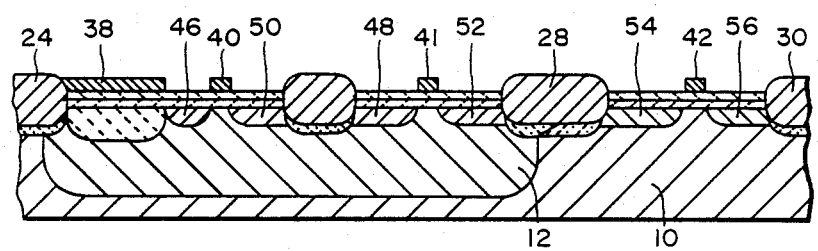
FIG.—4
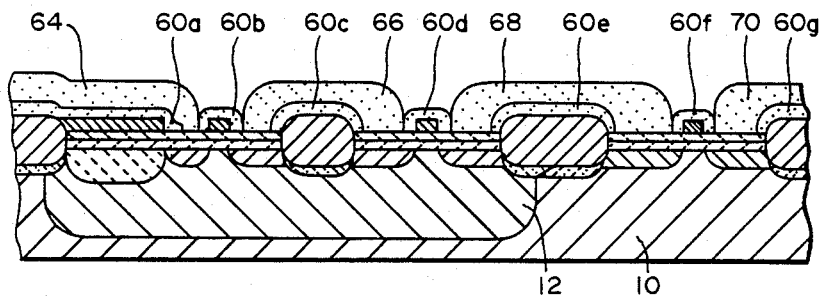
FIG.—5

INTEGRATED CAPACITOR AND METHOD OF FABRICATING SAME

BACKGROUND OF THE INVENTION

1. Field of the Invention

The present invention relates to integrated capacitors and a method of fabricating integrated capacitors; more particularly, to the fabrication of integrated capacitors on semiconductor substrates in conjunction with the fabrication of other elements in field effect transistors.

2. Description of the Related Art

Recently, as discussed in "Design Boosts Performance of Monolithic Switched Filters," Electronics, Oct. 28, 1985, page 44 (the Switched Filters Article), benefits have been derived by forming integrated switched capacitors in silicon-gate CMOS semiconductor devices. In the integrated capacitor disclosed in the Switched Filters Article, a bottom plate of the capacitor is diffused in a semiconductor substrate, an oxide layer formed on the substrate functions as the dielectric (or insulating layer) of the capacitor, and a polysilicon layer, formed on the oxide layer, serves as the top plate of the capacitor. The Switched Filters Article discloses a method of diffusing the bottom plate of an integrated capacitor by providing a mask which allows for a rich diffusion in the substrate. The rich diffusion, which is utilized to form the bottom plate of an integrated capacitor, is provided prior to the formation of the oxide layer and the polysilicon top plate.

There are, however, difficulties with the diffusion of the capacitor plate in the substrate prior to the formation of the oxide layer. One specific problem is the difficulty in producing thin gate oxide or dielectric layers on a richly diffused, or highly doped, region of a substrate. It is well known that for a richly diffused or highly doped substrate, the growth rate of an oxide is proportional to the concentration of the diffusion or dopant ions in the underlying layer. Specifically, a higher concentration of dopant ions leads to a faster growth rate for the oxide layer. Fast growth rates make it extremely difficult to form thin (e.g., less than 1000 Å) oxide layers. Further, if the doping is not uniform the thickness of the oxide layer will not be uniform. Differences in the thickness of the oxide layer will cause variations in the capacitance, and if the oxide layer is too thin a breakdown of the capacitor may occur. For both of these reasons, it is difficult to form thin oxide layers on highly doped regions of a substrate.

On the other hand, a highly doped bottom plate is desirable for an integrated capacitor in order to provide relatively constant capacitance as a function of voltage. It is also desirable, from the standpoint of fabricating both silicon-gate field effect transistors and integrated capacitors, that the associated oxide or dielectric layer be as thin as possible.

It is well known, that the capacitance C of a capacitor, as defined by the equation $C = \epsilon_o A/d$ (where A is the area of the capacitor plates and d is the separation of the plates) is directly proportional to the area of the capacitor plates and inversely proportional to the separation of the plates, i.e., the thickness of the dielectric separating the plates. Thus, reducing the thickness of the dielectric increases the capacitance, enabling a capacitor having a thinner dielectric to provide the same capacitance as a capacitor having a larger area and a thicker dielectric. For example, reducing the thickness of the oxide layer by one-half allows the area of the capacitor plates to be reduced by one-half while providing the same capacitance.

SUMMARY OF THE INVENTION

It is, therefore, an object of the present invention to provide a method of fabricating an integrated capacitor having an extremely thin dielectric or insulating layer.

A further object of the present invention is to provide a method of fabricating an integrated capacitor in which the growth rate of the oxide serving as the insulating layer can be accurately controlled.

A still further object of the present invention is to provide a method of fabricating an integrated capacitor having an insulating layer of less than 500 Å.

Another object of the present invention is to provide a method of fabricating a semiconductor device including an integrated capacitor in which an oxide layer of less than 500 Å serves as the gate oxide layer in a field effect transistor and as the dielectric in the integrated capacitor.

Another object of the present invention is to provide a method of fabricating an integrated capacitor having a thin insulating layer which can be combined with the process of fabricating silicon-gate CMOS semiconductor devices.

Another object of the present invention is to provide an integrated capacitor having an insulating layer having a thickness of less than 500 Å.

Another object of the present invention is to provide an integrated capacitor requiring less area in a semiconductor device.

The present invention is directed to a method of fabricating an integrated capacitor including a diffused bottom plate and an insulating layer having a thickness of less than 500 Å. In accordance with the method of the present invention the fabrication of an integrated capacitor having a thin insulating layer includes the steps of forming an oxide layer on a semiconductor substrate, providing through the oxide layer a first capacitor plate in a selected portion of the substrate, and forming a second capacitor plate on the portion of the oxide layer corresponding to the selected portion of the substrate. Since the oxide layer is formed on an undoped or lightly doped substrate, an extremely thin oxide layer having a uniform thickness can be formed with good reproducibility. Additionally, by providing the first capacitor plate through the oxide layer, the level of doping in the first capacitor plate may be increased because any effects of this doping level on the growth of the oxide layer are eliminated.

The method of the present invention may be utilized to fabricate capacitors having insulating layers of up to 3000 Å where it is desireable to carefully control the characteristics of the capacitor.

It has been discovered that implanting through the oxide layer necessitates a restructuring of the oxide layer after the implant. Such a restructuring can be performed by annealing the capacitor, and in the method of the present invention the requirement of restructuring the oxide layer is turned to an advantage. An additional oxide layer is grown during the annealing, thereby providing a dual oxide layer with the advantages achieved with a dual oxidation process. The annealing step additionally serves to activate the dopant ions implanted through the first oxide layer.

A specific advantage of the present invention is that the oxide layer is grown on an undoped or relatively lightly doped substrate so that the growth rate of the oxide layer is not a strong function of the concentration of the dopant ions. This provides for the formation of extremely thin oxide layers having a uniform thickness for use as the dielectric in the integrated capacitor.

A further advantage of the present invention is that an integrated capacitor having a greatly reduced area but having the same capacitance as prior art integrated capacitors can be fabricated by reducing the thickness of the dielectric layer in the capacitor. In the related technology of fabricating integrated circuit components, such reductions in the size of devices are considered to be great technological improvements.

A still further advantage of the present invention is that the benefits of the dual oxidation process are applied to integrated capacitors, as well as to field-effect transistors.

BRIEF DESCRIPTION OF THE DRAWINGS

FIGS. 1-5 are cross-sectional views showing various steps in the fabrication of a semiconductor device including an integrated capacitor in accordance with the method of the present invention, wherein FIG. 5 shows a completed device.

DESCRIPTION OF THE PREFERRED EMBODIMENTS

A method of fabricating a semiconductor device including an integrated capacitor in accordance with a preferred embodiment of the present invention will be described with reference to FIGS. 1-5. The semiconductor device described herein is a silicon-gate CMOS device; however, the method of the present invention is applicable to many types of semiconductor devices, including various field effect transistors (FETs).

As shown in FIG. 1, a semiconductor substrate 10, for example n-type silicon, has a well 12 of the opposite conductivity type, for example p-type, formed therein. The well 12 may be formed by conventional methods such as ion implantation followed by annealing, or by epitaxial growth of an opposite conductivity type layer followed by doping of the portions of the epitaxial layer surrounding the well 12. If the p-type well 12 is implanted, the dopant ions may be boron implanted at an energy of approximately 90 KeV with a dosage of approximately $7.0 \times 10^{12} cm^{-2}$. Except as otherwise indicated, all implant energies and dosages, annealing times and temperatures, and thicknesses are approximate and may be altered in accordance with the knowledge of those skilled in the art. The boron implant may be followed by annealing for thirteen hours in an atmosphere of nitrogen ($N_2$) with one percent oxygen ($O_2$) at 1200° C., followed by forty minutes in an atmosphere of $O_2$ at 1200° C.

After the well 12 has been formed, active regions (areas where individual semiconductor devices are to be fabricated) are masked with nitride layers (not shown) formed by standard techniques. Thereafter, a mask (not shown) exposing only the well 12 is formed on the surface of the device by a standard technique. Field implants, or electrical isolation regions, 14-16 are formed by standard techniques using the nitride layers to protect the active regions in the well 12. The mask exposing the well 12 is then removed, the well 12 is masked, and a second field implant is performed, using further nitride layers (not shown), and field implants 20 and 21 are formed. The field implant regions 14-16 in the p-type well 12 are formed by implanting boron ions at an energy of 80 KeV with a dose of $1.36-1.44 \times 10^{13} cm^{-2}$. Field implant regions 20 and 21 in the n-type substrate are fabricated by implanting arsenic ions at an energy of 80 KeV with a dose of $1.0 \times 10^{13} cm^{-2}$. Then, field oxide regions 24-27 are grown by standard oxidation techniques. The field oxide regions 24-27 have a thickness of less than 2 $\mu m$, for example, 1.1-1.2 $\mu m$. After the field oxide regions 24-27 have been grown, the nitride layers (not shown) utilized to mask the active regions are removed.

With reference to FIG. 2, first oxide layers 32a-c are grown on the active regions by annealing the device for two hours in an atmosphere comprising oxygen and trichlorethane (TCA) at a temperature of 900° C. The first oxide layers 32a-c are 380 to 420 Å thick. First oxide layer 32a serves both as a gate oxide for a FET and as a dielectric layer for an integrated capacitor; the term "oxide layer" will be used to refer to layers serving either of these purposes. Then a mask (not shown) is formed to expose only a selected portion of the well 12 and a first, or bottom, capacitor plate 34 is implanted. In the preferred embodiment, phosphorous ions are implanted at an energy of 80 KeV with a dose of $3.5 \times 10^{15} cm^{-2}$.

The implantation of the first capacitor plate 34 through the first layer 32a necessitates restructuring the first layer 32a through which the first capacitor plate 34 is implanted. This restructuring is accomplished by annealing the device for five minutes in an atmosphere comprising $N_2$, $O_2$, and TCA at a temperature of 1050° C. The approximate composition of the annealing atmosphere includes 89% $N_2$, 10% $O_2$, and 1% TCA.

During the restructuring annealing step, second oxide layers 36a-c, shown in FIG. 3, having a thickness of 20-60 Å, are grown at the interfaces of the respective first oxide layers 32a-c and the silicon forming the substrate 10 or the well 12. The total thickness of the oxide layer comprising the first and second oxide layers 32a-c and 36a-c is 400-480 Å, i.e., less than 500 Å. The formation of first and second oxide layers 34 and 36, as shown in FIGS. 2-3, is similar to the two-step trichloroethylene oxidation process disclosed in "Oxidation Characteristics and Electrical Properties of Low Pressure Dual TCE Oxides," by Y. C. Chang and P. Y. Liu, Journal of the Electro-Chemical Society, February 1984 (page 354). (It is noted that the present invention utilizes TCA in place of the more toxic trichlorethylene (TCE) disclosed by this article.)

In alternative embodiments the first oxide layers 32a-c may have a thickness of 1,500 Å or less if the first capacitor plate 34 is formed by implanting phosphourous to provide an N+-type capacitor plate or a thickness of 3000 Å or less if the first capacitor plate 34 is formed by implanting boron to provide a p+-type capacitor plate.

A polysilicon layer (not shown as a complete layer) having a thickness of less than 10,000 Å, for example, 5250-5750Å, is grown on the second oxide layers 36a-c. The polysilicon layer is doped by annealing the device for thirty-five minutes in an atmosphere of phosphorous tribromide (PBr3) at a temperature of 950° C. Alternatively, the annealing atmosphere may be phosphine (PH3) or phosphorous oxychloride (POCl3). With reference to FIG. 3, the polysilicon layer is then masked and etched using standard techniques to form a second capacitor plate 38 for the integrated capacitor and gates 40-42 for silicon-gate FETs. The dimensions of the gates 40-42 will define the channel length of the FETs.

In an alternative embodiment the second capacitor plate and the gates for the FETs are formed by depositing and patterning a metal, for example, alloys of aluminum, or refractory metal silicides, and other metals and alloys known to be suitable for the desired purpose.

Source and drain regions are then implanted using the gates 40–42 as masks, thereby self-aligning the source and drain regions and the gates, and defining the channel regions. In particular, with reference to FIG. 4, a mask (not shown) is formed to expose only the region of the device corresponding to the well 12 and n+-type regions 46, 48, 50, and 52 are implanted. In the preferred embodiment, a double diffused implant is performed; in the double diffused implant phosphorous ions are implanted at an energy of 100 KeV and a dose of $3.0 \times 10^{13} cm^{-2}$, then arsenic ions are implanted at an energy of approximately 90 KeV with a dose of approximately $6.0 \times 10^{15} cm^{-2}$, and both implants are simultaneously diffused. N+-type regions 46, 48, 50 and 52 form source and drain regions for FETs associated with gates 40 and 41. Thereafter, the mask (not shown) exposing the well 12 is removed and a mask (not shown) is formed to cover the well region 12 so that p+-type regions 54 and 56 may be implanted in the n-type substrate 10. In one embodiment, boron ions are implanted at an energy of 20 KeV with a dosage of $5.0 \times 10^{10} cm^{-2}$.

The p+-type regions 54 and 56 form source and drain regions for a complementary FET corresponding to gate 42.

With reference to FIG. 5, vapox (deposited oxide) regions 60a–g are formed by masking selected portions of the second oxide layers 36a–c where the metal contacts 64, 66, 68, and 70 are to be formed and then providing the vapox layer. The vapox layer includes 1000 Å of undoped oxide and 1.6 μm of 2–8% phosphorous doped oxide. Thereafter, the device is annealed to activate the p+-type regions 54 and 56 and to flow the vapox regions 60a–g. This activation annealing is performed for ten minutes in an O₂ atmosphere at a temperature of 950° C. Then, a mask (not shown) is formed and metal contacts 64, 66, 68 and 70 are fabricated. In the preferred embodiment, aluminium contacts are sputter deposited. Subsequently, the device is annealed for twenty minutes in an atmosphere comprising hydrogen (H₂) and N₂ at a temperature of 465° C. Then, standard passivation layers are formed in accordance with techniques well known to those skilled in the art.

The preferred embodiment of the method of the present invention relates to fabricating a silicon-gate CMOS device including an integrated capacitor. It is to be understood that many other embodiments of integrated capacitors fabricated in accordance with the present invention are contemplated. For example, if a complementary device is not desired it is possible to fabricate only an integrated capacitor, or an integrated capacitor and a FET or FETs of only one conductivity type, without a well.

We claim:

1. A method of fabricating a capacitor on a semiconductor substrate, comprising the steps of:
    (a) forming a first oxide layer on the substrate;
    (b) providing through the first oxide layer a first capacitor plate in a selected portion of the substrate;
    (c) annealing the capacitor after said step (b) to restructure the first oxide layer and to grow a second oxide layer at the interface of the first oxide layer and the substrate; and
    (d) forming a second capacitor plate on the portion of the first oxide layer corresponding to the selected portion of the substrate.

2. A method of fabricating a capacitor according to claim 1, wherein said step (a) comprises growing the first oxide layer to a thickness of less than approximately 500 Å.

3. A method of fabricating a capacitor according to claim 2, wherein said step (a) comprises growing the first oxide layer to a thickness of approximately 380–420Å.

4. A method of fabricating a capacitor according to claim 1, wherein said step (b) comprises implanting a dopant species through the first oxide layer.

5. A method of fabricating a capacitor according to claim 1, wherein said step (a) comprises growing the first oxide layer in an atmosphere comprising oxygen (O₂) and trichloroethane (TCA) at a temperature of approximately 900° C.

6. A method of fabricating a capacitor according to claim 1, wherein said step (c) comprises growing the second oxide layer to a thickness of approximately 20–60Å.

7. A method of fabricating a capacitor according the claim 1, wherein said step (c) comprises annealing the capacitor in an atmosphere comprising nitrogen (N₂), oxygen (O₂) and trichloroethane (TCA) at a temperature of approximately 1050° C.

8. A method of fabricating a capacitor according to claim 7, wherein said step (c) comprises annealing the capacitor in an atmosphere comprising 89% N₂, 10% O₂ and 1% TCA.

9. A method of fabricating a capacitor on a semiconductor substrate, comprising the sequential steps of:
    (a) forming a first oxide layer on the substrate;
    (b) forming a first capacitor plate in a selected portion of the substrate underlying the oxide layer;
    (c) annnealing the first oxide layer to cure any defects in the first oxide layer and to grow a second oxide layer at the interface of the first oxide layer and the substrate; and
    (d) forming a second capacitor plate on the portion of the first oxide layer corresponding to the selected portion of the substrate.

10. A method of fabricating a capacitor according to claim 9, wherein said step (a) comprises growing the first oxide layer to a thickness of less than approximately 500 Å.

11. A method of fabricating a semicodnuctor device including a capacitor on a semiconductor substrate, comprising the steps of:
    (a) forming a first oxide layer on the substrate;
    (b) implanting a dopant species in a selected portion of the substrate through the first oxide layer;
    (c) annealing the semiconductor device to diffuse the dopant species implanted in said step (b) to form a first capacitor plate in the substrate, to restructure the first oxide layer, and to grow a second oxide layer at the interface of the substrate and the first oxide layer;
    (d) forming a gate on a selected portion of the first oxide layer and forming a second capacitor plate on the portion of the first oxide layer corresponding to the position of the first capacitor plate; and (e) forming source and drain regions in portions of the substrate on opposite sides of the portion of the substrate corresponding to the position of the gate.

12. A method of fabricating a semiconductor device including a capacitor according to claim 11, wherein:
   said step (a) comprises growing the first oxide layer in an atmosphere comprising oxygen ($O_2$) the trichlorethane (TCA) at a temperature of approximately 900° C.; and
   said step (c) comrpises annealing the semiconductor device in an atmosphere comprising nitrogen ($N_2$), oxygen ($O_2$) and trichlorethane (TCA) at a temperature of approximately 1050° C.

13. A method of fabricating a semiconductor device including a capacitor according to claim 12, wherein said step (c) comprises annealing the semiconductor device in an atmosphere comprising 89% $N_2$, 10% $O_2$ and 1% TCA.

14. A method of fabricating a semiconductor device including a capacitor according to claim 11, wherein:
   said step (a) comprises growing the first oxide layer to a thickness of approximately 380–420 Å; and
   said step (c) comprises growing the second oxide layer to a thickness of approximately 20–60 Å.

15. A method fabricating a semiconductor device including a capacitor according to claim 12, wherein:
   said step (a) comprises growing the first oxide layer to a thickness of approximately 380 to 420 Å; and
   said step (c) comprises growing the second oxide layer to a thickness of approximately 20–60 Å.

16. A method of fabricating a semiconductor device including a capacitor on a semiconductor substrate of one conductivity type, comprising the steps of:
   (a) forming a well of the opposite conductivity type in the substrate;
   (b) growing a first oxide layer having a thickness of 380–420 Å on the well in an atmosphere comprising oxygen ($O_2$) and trichlorethane (TCA) at a temperature of approximately 900° C.;
   (c) implanting through the first oxide layer a dopant species corresponding to the one conductivity type in a selected portion of the well;
   (d) annealing the semiconductor device in an atmosphere comprising nitrogen ($N_2$), $O_2$ and TCA at a temperature of 1050° C. to diffuse the dopant species implanted in said step (c) to form a first capacitor plate, and to restructure the first oxide layer, and thereby growing a second oxide layer having a thickness of 20–60 Å at the interface of the well and the first oxide layer;
   (e) forming a second capacitor plate on the portion of the first oxide layer corresponding to the position of the first capacitor plate;
   (f) forming a gate on a selected portion of the first oxide layer; and
   (g) implanting self-aligned source and drain regions utilizing the gate as a mask.

17. A method of fabricating a capacitor having a uniform capacitance as a function of voltage on a semiconductor substrate, comprising the sequential steps of:
   (a) forming a first oxide layer on the substrate;
   (b) providing through the first oxide layer a first capacitor plate in a selected portion of the substrate;
   (c) annealing the thus formed structure in an oxidizing atmosphere to cure any defects in the crystalline structure of the first oxide layer caused during said step (b), thereby growing a second oxide layer at the interface of the first oxide layer and the substrate; and
   (d) forming a second capacitor plate on the portion of the first oxide layer corresponding to the selected portion of the substrate.

* * * * *